United States Patent [19]

Chapple-Sokol et al.

[11] Patent Number: 5,465,859
[45] Date of Patent: Nov. 14, 1995

[54] DUAL PHASE AND HYBRID PHASE SHIFTING MASK FABRICATION USING A SURFACE ETCH MONITORING TECHNIQUE

[75] Inventors: Jonathan D. Chapple-Sokol, Poughkeepsie; Louis L.-C. Hsu, Fishkill; Paul J.-M. Tsang, Poughkeepsie, all of N.Y.; Chi-Min Yuan, Austin, Tex.

[73] Assignee: International Business Machines Corporation, Armonk, N.Y.

[21] Appl. No.: 234,899

[22] Filed: Apr. 28, 1994

[51] Int. Cl.⁶ .................. B44C 1/22; C23F 1/02
[52] U.S. Cl. .............. 216/12; 216/59; 216/67; 216/75; 216/79; 430/5
[58] Field of Search .................. 156/626, 643, 156/656, 657, 659.1, 662, 663; 252/79.1; 204/192.32, 192.33, 192.35, 192.37; 430/5; 216/2, 2, 12, 56, 59, 67, 75, 79

[56] References Cited

U.S. PATENT DOCUMENTS

| | | | |
|---|---|---|---|
| 4,496,425 | 1/1985 | Kuyel | 156/626 |
| 4,722,878 | 11/1985 | Watakabe et al. | 430/5 |
| 4,780,382 | 10/1988 | Stengl et al. | 430/5 |
| 4,902,899 | 2/1990 | Lin et al. | 250/492.1 |
| 4,927,485 | 5/1990 | Cheng et al. | 156/345 |
| 4,937,129 | 6/1990 | Yamazaki | 428/195 |
| 5,024,726 | 6/1991 | Fugiwara | 156/653 |
| 5,030,316 | 7/1991 | Motoyama et al. | 156/626 |
| 5,100,503 | 3/1992 | Allman et al. | 156/643 |
| 5,170,217 | 12/1992 | Nishimoto et al. | 356/359 |
| 5,200,796 | 4/1993 | Lequime | 356/346 |
| 5,225,035 | 7/1993 | Rolfson | 156/663 |

OTHER PUBLICATIONS

M. Levenson, "Improving Resolution in Photolithography with a Phase-Shifting Mask", IEEE Trans. on Electron Devices, vol. ED-29, No. 12, Dec. 1982, pp. 1828–1836.

S. Wolf, et al., Silicon Processing for the VLSI Era—vol. 1: Process Technology, Lattice Press, 1986.

P. Burggraaf, Semiconductor International, Feb. 1992, pp. 44–55.

Primary Examiner—William Powell

[57] ABSTRACT

A subtractive method for making a Levenson type lithographic phase shift mask using a sacrificial etch monitor film in which some of the monitor film is left standing on the opaque portions of the mask. The monitor film otherwise is consumed when it is simultaneously etched with selected portions of the mask substrate to produce recesses of desired depth in the substrate. The etching is stopped upon detecting that the etched monitor film is completely consumed. The technique also is adapted for the fabrication of a RIM type lithographic phase shift mask combined with the Levenson type phase shift mask in the same mask. The technique further is adapted to include 90 degree shift transitions at the end of the Levenson line-space pairs of the mask. The monitor film left standing on the opaque portions of the mask provides self-aligned phase error correction to offset sidewall scattering in the Levenson type mask.

10 Claims, 5 Drawing Sheets

DUAL PHASE AND HYBRID PHASE SHIFTING MASK FABRICATION USING A SURFACE ETCH MONITORING TECHNIQUE

BACKGROUND OF THE INVENTION

The present invention generally relates to submicron photolithography using a phase shifting mask and, more particularly, to a subtractive fabrication method for such a mask employing a sacrificial etch monitor film to control the etch depth of the phase shifting portions of the mask.

Briefly, a phase shifting mask is a transmission mask on which material has been selectively removed or added to change the optical phase of light passing through adjacent apertures. Interference effects between waves from adjacent apertures can lead to enhanced resolution.

It is known in the art that a Levenson type phase shifting mask is very effective to improve lithography resolution for submicron line and space patterns. Such a mask is described in the paper by Levenson et al, "Improved Resolution and Photolithography with a Phase-Shifting Mask", IEEE Transactions on Electron Devices, ED-29, page 1828 (1982).

It is also known that a RIM type phase shifting mask is advantageous for making contact openings and/or isolated space or lines. It is sometimes desirable to include both the Levenson type and the RIM type on the same phase shifting mask to form a hybrid mask. The state-of-the-art methods are either designed for the Levenson type PSM or for the RIM type PSM. None exists that is designed for fabricating a L-R hybrid mask. Types of phase shifting masks are described by P. Burggraaf in Semiconductor International, February. 1992, pp 44–55.

One concern relating to the use of a Levenson type mask is that at the end of the line-space patterns there are residual "loops" caused by phase edge effects of the transmitted waves which link together the line patterns of each adjacent pair of lines. One known solution to this problem is to use a block-out or trim mask to remove the loops. Another known solution is to provide a 90 degree shift transition at the end of the Levenson line-space pairs on the mask. In order to create such a 90 degree shift transition, either an additive or a subtractive method can be employed.

The additive method, however, requires an etch stop film. To assure that the film does not degrade mask performance, several aspects thereof must be considered, e.g., interface effect, film defect density, film refractive index, degree of transmission at the exposure wavelength, etc. The subtractive method avoids the foregoing problems but suffers from another difficulty, namely, that precise etch depth control must be attained to a degree not yet sufficiently demonstrated to make mask fabrication feasible.

SUMMARY OF THE INVENTION

One object of the present invention is to provide a subtractive method for making a hybrid mask combining both the Levenson type and the RIM type phase shift masks characterized by precise etch depth control.

An additional object is to provide a subtractive method for making a 90 degree phase transition for a Levenson type mask characterized by precise etch depth control.

Another object of the present invention is to provide a subtractive method for making a Levenson type phase shift mask using a sacrificial etch monitor film in which monitor film residue remains on top of opaque patterns and has no negative impact on lithography performance.

A further object is to provide a subtractive method for making a Levenson type phase shift mask using a sacrificial etch monitor film in which any monitor film residue has positive impact on lithography performance by providing self-aligned phase error correction.

These and other objects of the present invention, as will appear from a reading of the following specification, are achieved in a best mode embodiment of the invention by the provision of a sacrificial etch monitor film, masked portions of which are etched simultaneously with masked substrate portions of a phase shifting photolithographic mask. By detecting when the etched portion of the monitor film is depleted, it is determined when the substrate etching should be halted. The film is placed over the opaque portions of the phase shift mask and is masked such that residue film portions, remaining after etching is halted, are located adjacent the sidewalls of the phase shift mask whereby the phase error normally caused by sidewall scattering is corrected. Provision is made for including the aforedescribed features in a Levenson type phase shifting mask having 90 degree shift transitions as well as in a hybrid mask including both Levenson and RIM type phase shift masks.

BEST MODE OF CARRYING OUT THE INVENTION

Figure 1A:
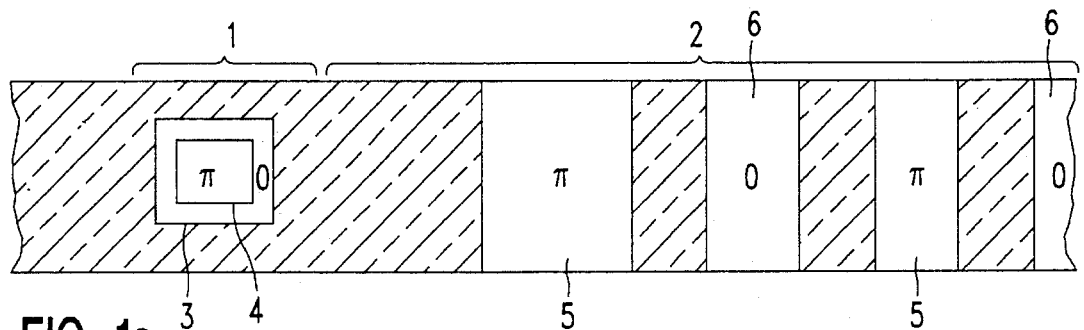
FIGS. 1 ($a$–$g$) is a plan view and a series of cross-sectional views of a hybrid phase shifting mask as it appears during each of a succession of respective fabrication steps of the present invention.

The plan view of FIG. 1 shows the optical phase shifts imparted by the hybrid mask aspect of the present invention to light passing through the unshaded regions. The first portion of the mask identified by the bracket 1 is the RIM-type phase shifting mask comprising a zero degree phase shifting region 3 surrounding a 180 degree ($\pi$) phase shifting region 4. The second portion of the mask identified by the bracket 2 is the Levenson-type phase shifting mask comprising an alternating succession of $\pi$-shift regions 5 and 0-shift regions 6. As was previously pointed out, a hybrid phase shifting mask comprising combinations of RIM type (1) and Levenson type (2) masks allows for optimum contact hole and line and space lithography resolution on the same phase shifting mask.

Referring now to the first step (FIG. 1$b$) in the process sequence of the present invention to fabricate the hybrid mask, a layer 7 of chromium is deposited to a thickness of about 800Å to 1000Å on a quartz mask substrate 8. A layer of CVD oxide 9 is deposited on layer 7. Oxide thickness is determined by mask exposure light wavelength, refractive index of the oxide, etc. For example, a 3650Å thickness is suitable for deep UV exposure light. After resist patterning (not shown), the oxide and chromium layers are etched down to the quartz substrate in a conventional manner to yield the pattern shown.

Figure 1B:
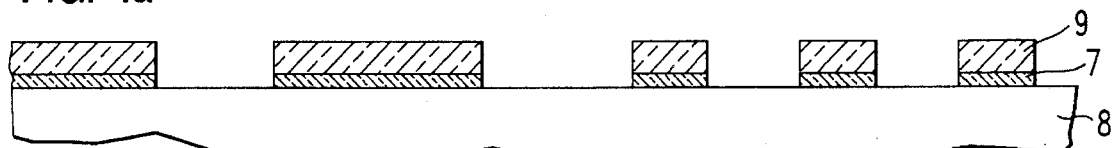
Figure 1C:
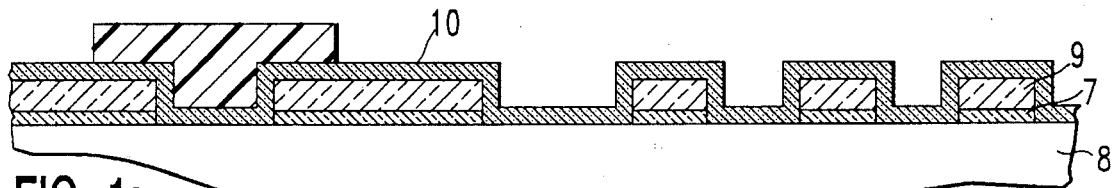
Figure 1D:
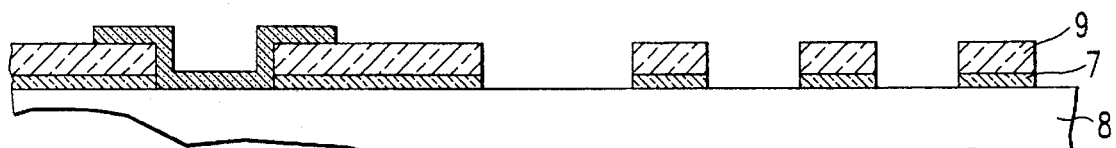
Figure 1E:
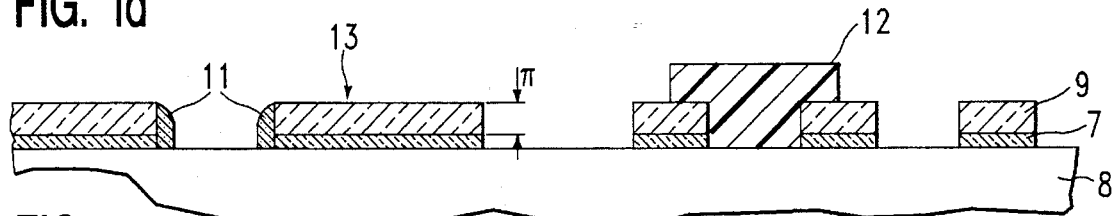
Figure 1F:
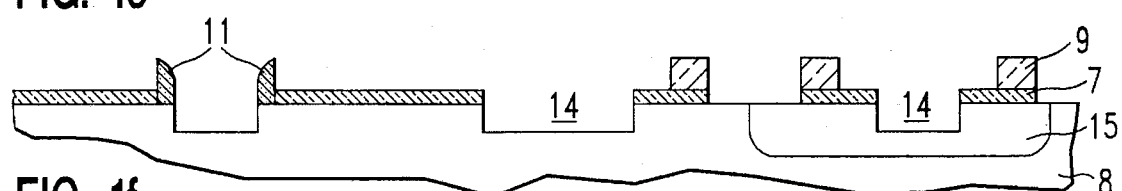
Figure 1G:
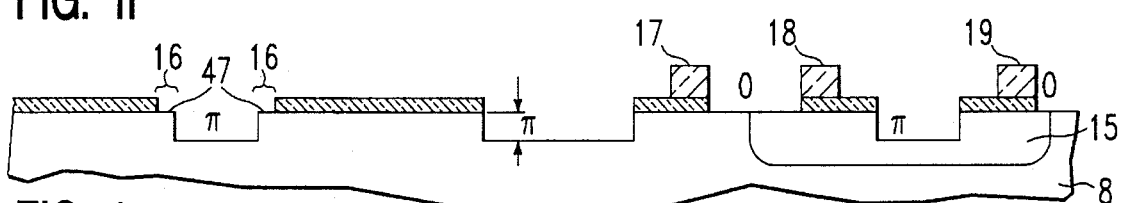

A layer 10 of plasma enhanced CVD polysilicon or amorphous silicon or any other type of suitable material, such as TiSi$_2$, that can be selectively chemically etched off (compared to SiO$_2$) is deposited as shown in FIG. 1c over the structure of FIG. 1b. The thickness of layer 10 is determined by the RIM size and is deposited at low temperature to avoid thermal stress. For example, to obtain a 0.1 μm RIM size on the exposed wafer (not shown) using a 4X tool, 4000Å of layer 10 is needed. Film 10 is trimmed with a trim mask and wet etching so that layer 10 remains only in the contact region as shown in FIG. 1d corresponding to region 1 of FIG. 1a.

Layer 10 next is directionally etched (FIG. e) to yield sidewall spacer 11 along the edges of each contact opening. A Cl$_2$/O$_2$ plasma etch has an etch selectivity of polysi to oxide of about 20 to 50:1 and is suitable.

The Levenson portion (2 of FIG. 1a) is now to be patterned in the line-space region of the hybrid mask. Photo resist 12 is patterned over the 0 degree phase shift areas and oxide 9 and quartz 8 are dry etched, where not covered by photo resist and chromium, respectively, in a CF$_4$/O$_2$ plasma using the oxide at location 13 as a monitor for etch endpoint detection (FIG. 1e) and then resist 12 is stripped to yield the structure of FIG. 1f. The well known laser interferometer end point technique is suitable for use at end point detection site 13. The oxide 9 thickness is pre-established to take into account the slightly different etching rates so that when the oxide 9 is fully removed the depth of the quartz recesses 14 is the desired amount to correspond to a π phase shift relative to light passing through the locations 15 where no recesses are made in the quartz substrate 8.

The polysilicon spacers 11 are stripped in a wet etch (FIG. 1g) to form the final structure of the hybrid mask. It should be noted that the etched recess 47 of the RIM type mask portion is surrounded by a shoulder region 16 so as to provide the needed π and 0 degree phase shifts of the RIM type mask as also shown in FIG. 1a regions 4 and 3, respectively. It also should be noted that residue oxide 17, 18 and 19 from the original layer 9 still remain adjacent the 0 degree phase shift sidewall regions. As will be described more fully later with the aid of FIG. 3, such residue oxide plays an important role in correcting for the phase error normally caused by sidewall scattering in phase shift masks having no oxide residue. Such sidewall scattering would occur only at the etched areas 14 and not on the unetched areas 15, the latter having no sidewalls. Inasmuch as the oxide residues of the etch monitor film are on top of the opaque chrome patterns, they have no deleterious effect on lithography performance ascribable to the property and quality of the oxide film.

Figure 2A:
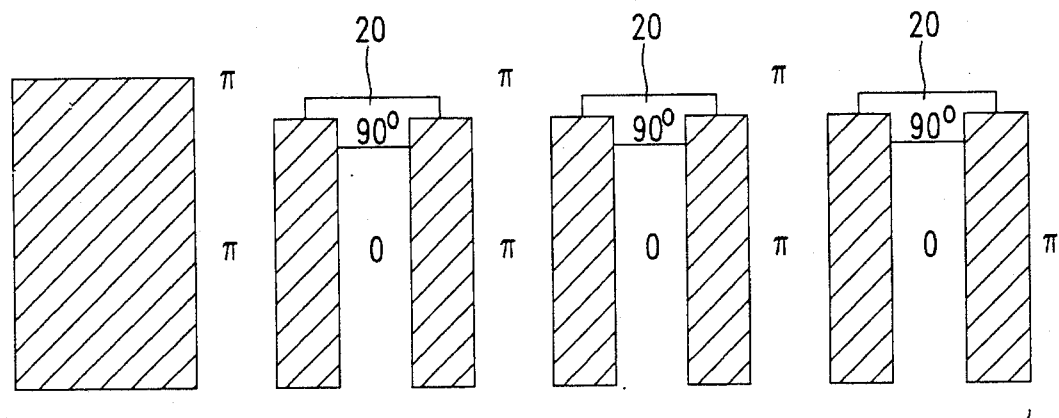
FIGS. 2 ($a$–$k$) shows plan views and a series of cross-sectional views of a multi-stage Levenson type phase shifting mask with 0, 90 and 180 degree shift transitions as it appears during each of a succession of respective fabrication steps of the present invention.

The plan view of FIG. 2a shows the optical phase shifts by the multistage Levenson mask of the present invention. With this invention, 90 degree phase transition regions are made at the two ends of adjacent line segments in trim areas 20. FIG. 2a shows only the phase transition regions in the upper ends of the segments. It is to be understood that similar 90 degree shift transition provision also is made at the lower ends (not shown) of the line segments in a complete mask design. The purpose of this is to trim away the loop that forms at the ends of a zero-shift pattern.

Figure 2B:
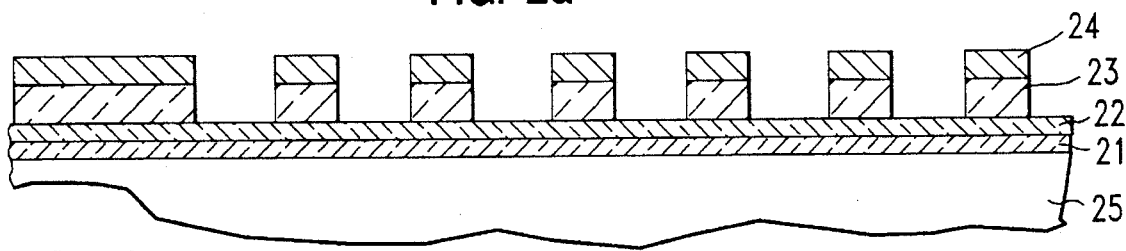
Figure 2C:
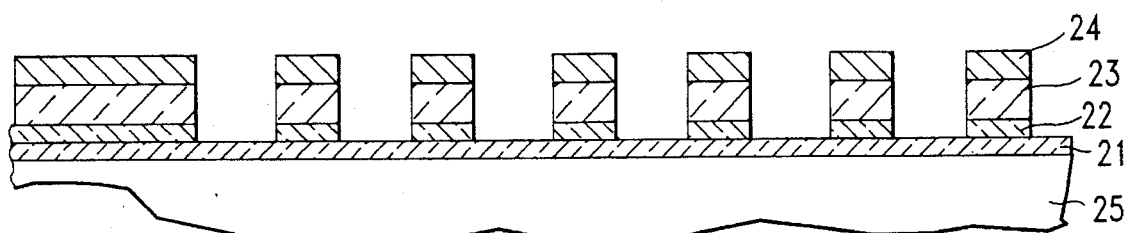

Referring now to the first steps in the process sequence of the present invention to fabricate the Levenson-type mask having 90 degree transition provision, multilayer films of CVD polysilicon 21 (500Å), chromium 22 (800Å), CVD oxide 23 equivalent in thickness to a 90 degree optical phase shift (for example 1825Å) and top CVD polysilicon 24 (500Å) are deposited on quartz substrate 25. A conventional mask patterning is carried out whereby polysilicon 24 is etched in a Cl$_2$/O$_2$ plasma and oxide 23 is etched in a CF$_4$/O$_2$ plasma, stopping at chromium layer 22 to yield the structure shown in FIG. 2b. Chromium 22 is etched next using a conventional method in a CF$_4$ and 50% O$_2$ plasma down to polysilicon 21 as shown in FIG. 2c.

Figure 2D:
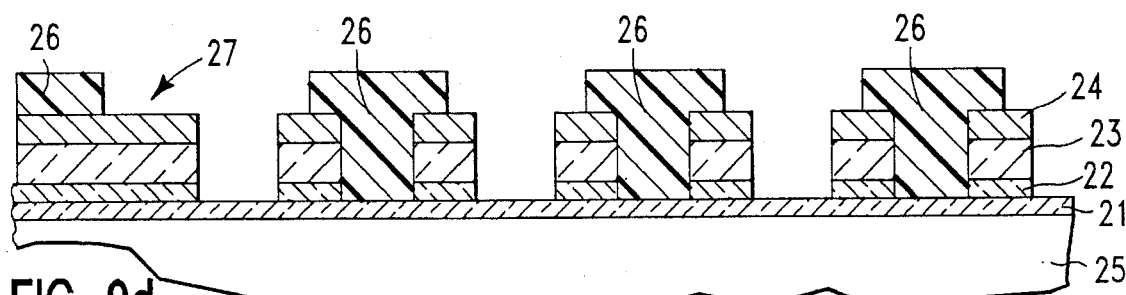
Figure 2E:
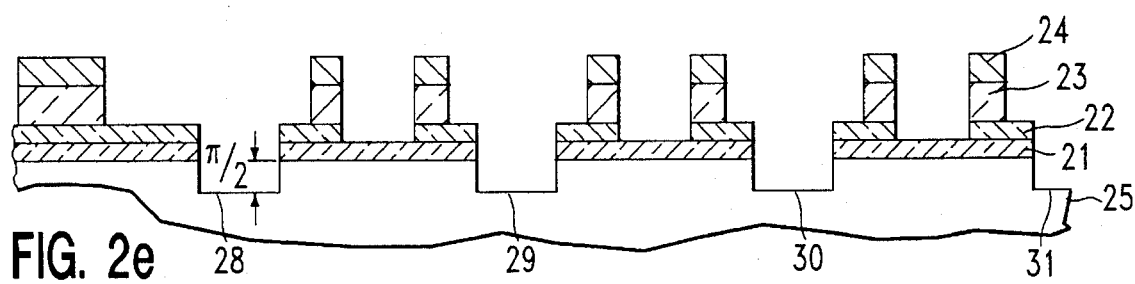
Figure 2F:
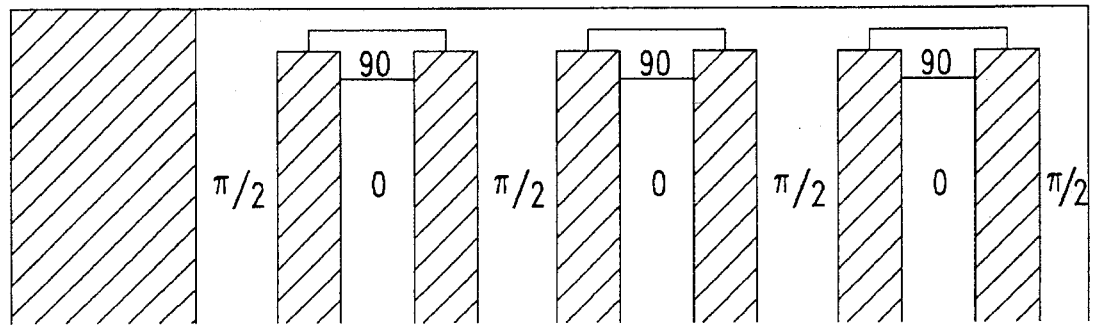

In the next series of steps, the Levenson pattern and first end point patterns are defined using mask 26 of FIG. 2d. The polysilicon top (24) and bottom (21) layers in the unmasked areas are etched simultaneously in a Cl$_2$/O$_2$ plasma down to oxide 23 and quartz 25, respectively. Then, the resist mask 26 is removed by O$_2$ ashing. The exposed portions of CVD oxide 23 (uncovered by etched polysilicon 24 in the previously unmasked areas) and the exposed quartz 25 are simultaneously etched in a CF$_4$ plasma. This plasma has a selectivity of oxide to chromium of about 15:1. The first end point detection site 27 is used to determine when the etched oxide 23 is completely removed, at which time the recesses 28, 29, 30 and 31 (FIG. 2e) have reached a depth equal to a 90 degree (π/2) optical phase shift which is above 1825Å for deep UV wavelengths. The corresponding plan view is show in FIG. 2f.

Figure 2G:
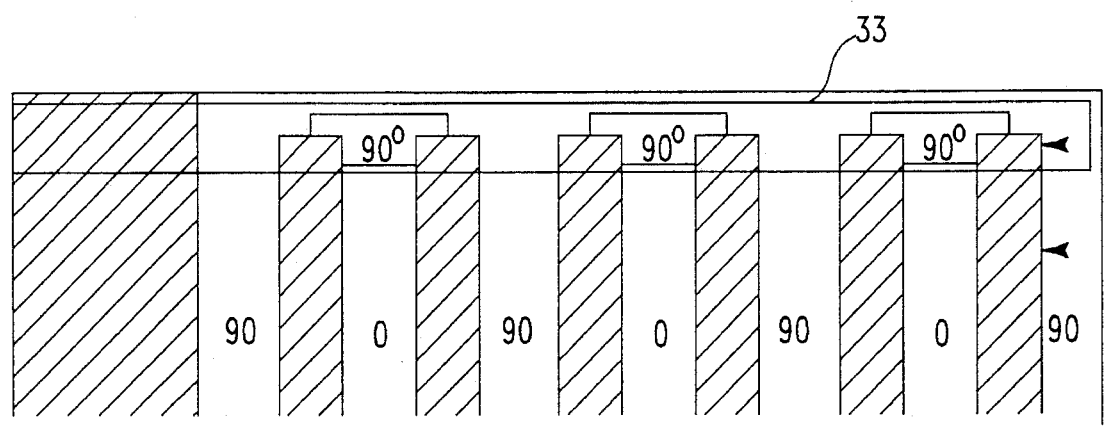
Figure 2H:
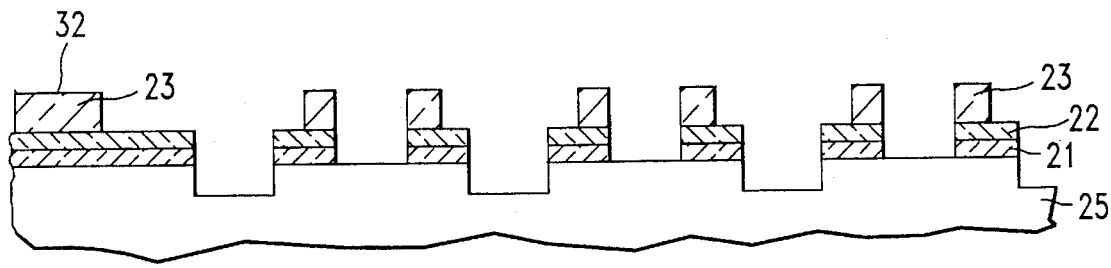
Figure 2I:
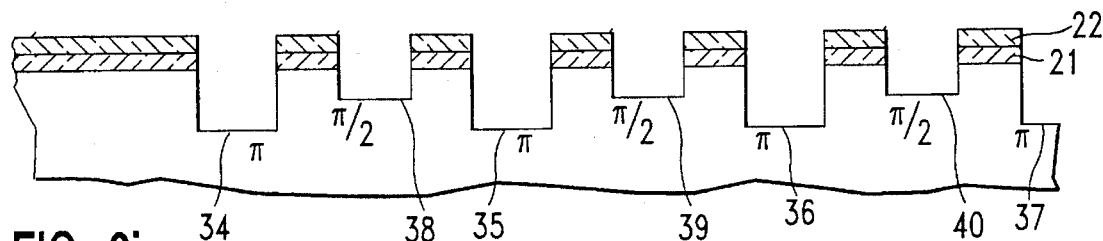
Figure 2J:
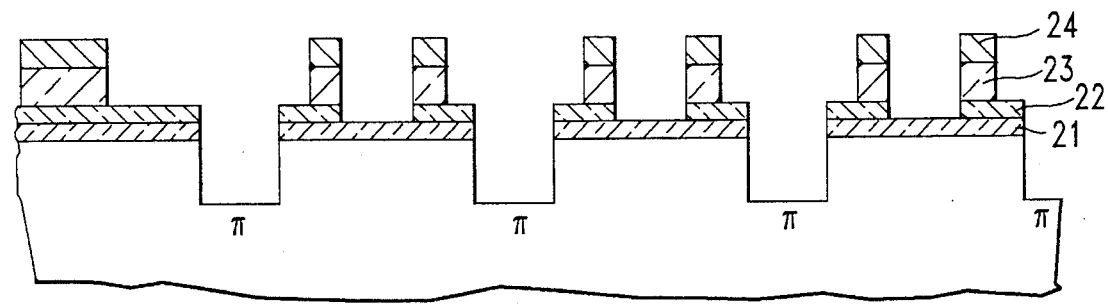
Figure 2K:
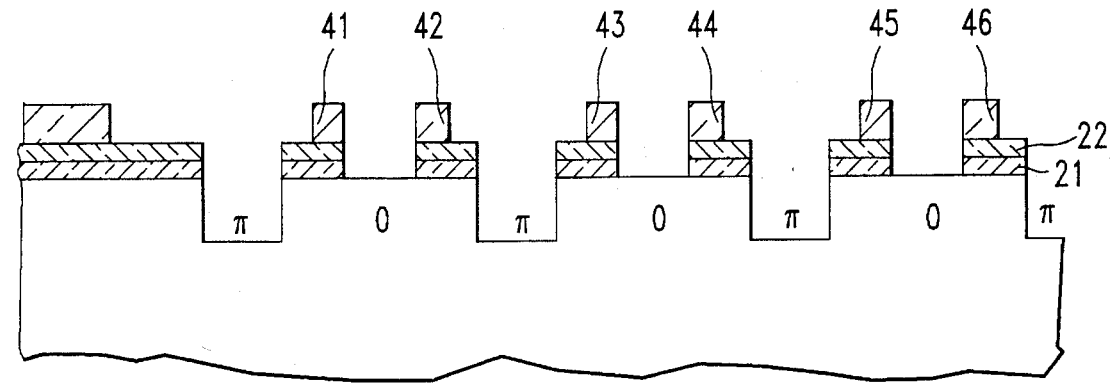

The trim area 20 and second end point detection site 32 are patterned by using mask 33 (FIG. 2g) whereby the (bottom) polysilicon 21 remaining in the trim area is removed along with the (top) polysilicon 24 exposed by the removal of mask 26 (FIG. 2h). The oxide 23 and quartz 25 are then etched simultaneously until the oxide is completely removed at end point detection site 32 whereupon recesses 34, 35, 36 and 37 of substrate 25 have been deepened to π optical phase shift depth and new recesses 38, 39 and 40 have been formed to π/2 optical phase shift depth. At this point in the process, the profiles in the trim and line/space areas are as shown in FIG. 2i and 2j, respectively. The final step is to etch the exposed polysilicon 24 and 21 in the 0°-phase areas to complete the line/space pattern (FIG. 2k). It will be noted that residue oxide 41 remains adjacent the 0 degree phase shift sidewall regions.

Figure 3:
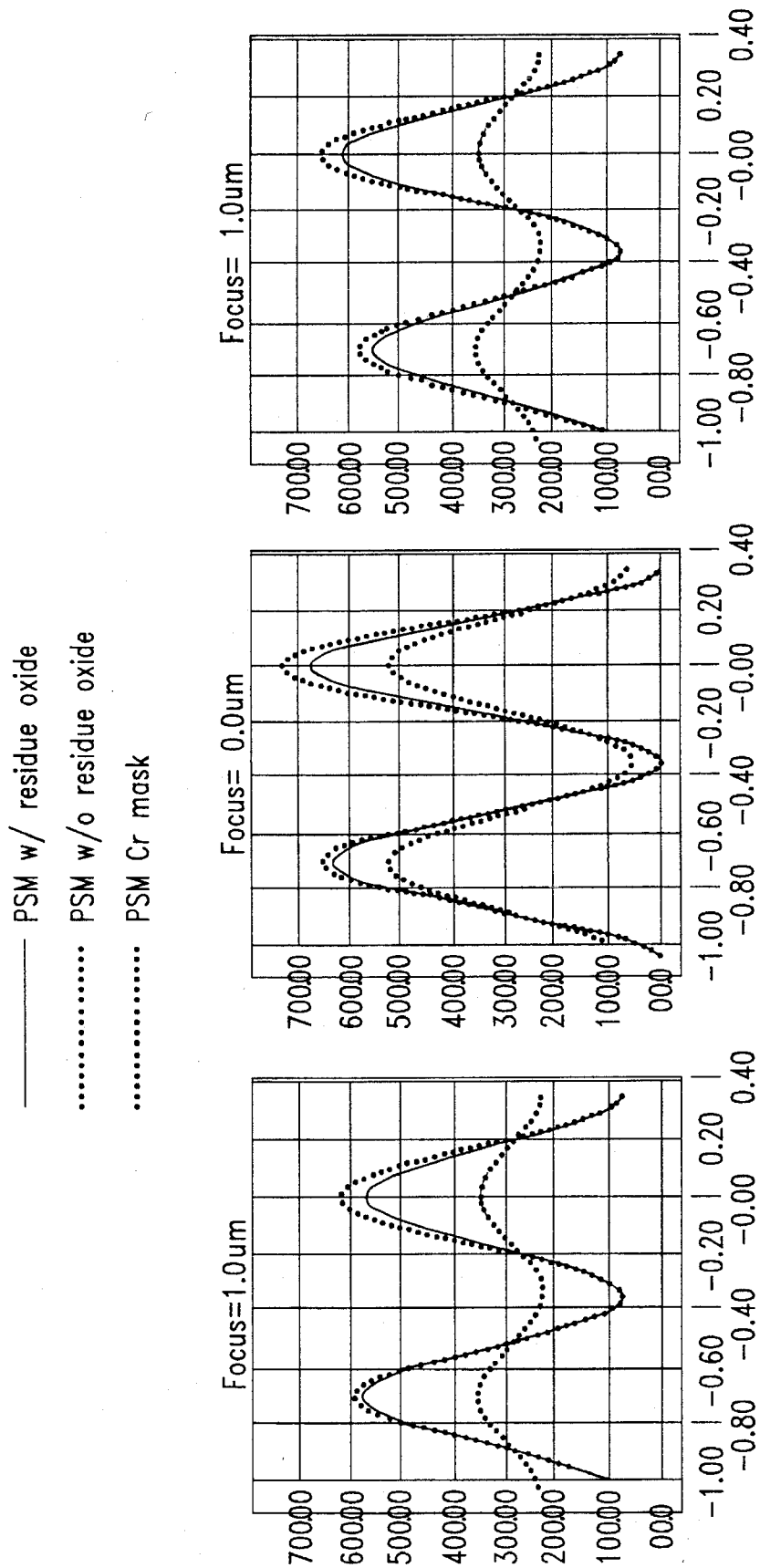
FIG. 3 is a series of plots of simulation calculations showing the self-aligned phase error correction afforded by the present invention.

The residual oxide 41, located exclusively on top of the chromium mask, has been found actually to help minimize the inherent phase error effect due to sidewall scattering on the Levenson mask. FIG. 3 is an intensity versus distance plot of simulated performance of the phase-shift mask (PSM) with residual oxide of the present invention in which the residual oxide thickness equals π phase shift (for i-line is 0.388 μm). It can be seen that the PSM with residual oxide has less intensity difference between two adjacent peaks than does the conventional PSM without residual oxide. The intensity on the PSM curve without residue oxide shows asymmetrical adjacent peaks. The left peak from the etched (or π) window has lower intensity due to the sidewall scattering effect than does the right peak that is without sidewall. As a result, the patterns printed on the wafer will show one pattern that is slightly bigger than the other.

Those skilled in the art will readily appreciate that different embodiments can be made within the spirit and scope of the invention and the following claims are not intended to be limited to the embodiments illustrated.

We claim:

1. A method for making a lithographic phase shift mask comprising providing a substrate, placing opaque material in a pattern over said substrate, mounting a sacrificial etch monitor first film solely on said opaque material, masking selected portions of said first film, in a first etching step, simultaneously etching said first film where unmasked and the exposed portions of said substrate until said unmasked first film is entirely removed, comprising, detecting when said unmasked film is entirely removed and, stopping said etching thereupon, said masked film remaining on said material when said etching is stopped.

2. The method defined in claim 1 and further including placing a second film on and between said first film of a successive pair of said patterned opaque material, and directionally etching said second film to produce sidewalls on said successive pair prior to said simultaneously etching step.

3. The method defined in claim 2 and further including removing said sidewalls subsequent to said simultaneously etching step.

4. The method defined in claim 1 and further comprising removing said masking of said selected portions of said first film, and in a second etching step, simultaneously etching said selected portions of said first film and the exposed portions of said substrate.

5. The method defined in claim 4 and further including placing a third film between said substrate and said material, selectively removing first portions of said third film prior to said first etching step, and selectively removing second portions of said third film subsequent to said first etching step but prior to said second etching step.

6. The method defined in claim 4 and further including placing a third film between said substrate and said material, selectively removing first portions of said third film prior to said first etching step, and selectively removing second portions of said third film subsequent to said second etching step.

7. The method in claim 4 wherein the thickness of said first film is selected such that when it is simultaneously etched with said substrate, the substrate will be etched to a depth equal to $\pi/2$ phase shift at the moment that said first film is completely removed.

8. The method in claim 1 wherein the thickness of said first film is selected such that when it is simultaneously etched with said substrate, the substrate will be etched to a depth equal to $\pi$ phase shift at the moment that said first film is completely removed.

9. The method in claim 1 wherein said detecting step comprises using laser interferometer end point detection on a dedicated portion of said first film.

10. The method defined in claim 1 wherein said masked film remaining on said material when said etching is stopped is located adjacent sidewalls of the phase shift mask openings whereby phase error caused by sidewall scattering is corrected.

* * * * *